United States Patent [19]
Takahashi et al.

[11] Patent Number: 4,759,038
[45] Date of Patent: Jul. 19, 1988

[54] PCM TRANSMISSION SYSTEM
[75] Inventors: Susumu Takahashi, Tokyo; Susumu Tanaka, Hachioji, both of Japan
[73] Assignee: Sansui Electric Co., Ltd., Tokyo, Japan
[21] Appl. No.: 800,838
[22] Filed: Nov. 22, 1985
[30] Foreign Application Priority Data
Nov. 22, 1984 [JP] Japan ................................ 59-247421
[51] Int. Cl.$^4$ ............................................. H04B 14/06
[52] U.S. Cl. ......................................... 375/27; 375/26; 375/38; 329/104; 332/11 D; 358/135
[58] Field of Search ....................... 375/26, 27, 30, 32, 375/34, 122, 38; 381/31; 329/104; 332/11 D; 358/135

[56] References Cited
U.S. PATENT DOCUMENTS 2,516,587  7/1950  Peterson ................................. 375/38
3,439,753  4/1969  Mounts et al. ......................... 375/27
3,723,909  3/1973  Condon ............................. 332/11 D
4,047,151  9/1977  Rydbeck et al. ..................... 375/34

Primary Examiner—Robert L. Griffin
Assistant Examiner—Andrew J. Telesz, Jr.
Attorney, Agent, or Firm—Sughrue, Mion, Zinn, Macpeak and Seas

[57] ABSTRACT

A PCM difference data is obtained from an original data, and an absolute data having a lower bit number than the original data is obtained at every data block, each data block comprising a plurality of the difference data. The transmission data includes the difference data and absolute data which is transmitted. The received data is separated into the difference data and the absolute data and the received difference data is integrated to provide the demodulated data. The integrated data is refreshed by the received absolute data only when the difference between the integrated data and absolute data is more than a predetermined value.

9 Claims, 10 Drawing Sheets

PCM TRANSMISSION SYSTEM

BACKGROUND OF THE INVENTION

1. Field of the Invention

The present invention relates to a PCM (Pulse Code Modulation) system, and more particularly to a correction for a signal lacking some data in the PCM transmission such as DPCM (differential PCM) in which a differential data is transmitted between samples transmitted. Here, the means transmission in a wide sense, including through a modulation/demodulation system and a recording/reproducing system etc., as well as through wireless or wire transmission lines. Accordingly, a "transmission path" means transmission/signalling lines, modulation/demodulation systems, and recording/reproducing systems, etc., including combinations thereof.

2. Prior Art

For example, in the DPCM transmission, a transmission error may be produced, which is incapable of being corrected by what is called error correction. In this instance, the signal in which an error signal is included is properly subjected to any correction for removing the error signal to obtain the original signal.

A sample case will be considered, in which, upon transmitting a sinusoidal signal as shown in FIG. 1, the signal is sampled for transmission at different points of A to D as in FIG. 1. Provided that the data is lost in part in the course of the transmission via a transmission system and is incapable of being retrieved at points B and C on the reception side, some correction therefore is needed. Assuming that a data is held just before it is partly lost (hereinafter referred to as "pre-hold") (when, in demodulation of DPCM, difference data are accumulated and integrated, partial lack of the difference data usually causes the "pre-hold"), this data provides points B' and C' on the reception side, as shown in FIG. 1. Then, provided that a proper difference data is yielded, it is added to the previous one, taking the point C' as its base. Accordingly, a point D of the original data provides a point D' as shown in FIG. 1 on the reception side, and allows the DC level of the signal to be sharply shifted. The amount of the shift of the DC level is equal to the accumulation of the lacked or deficient data values. In addition, with a dynamic range DR of a demodulation system, or a later stage regeneration system provided, as shown in FIG. 1 for example, the data at point D' is completely over the dynamic range DR, so that the demodulation/regeneration system is saturated, allowing a regenerated signal to be clipped.

To solve the problem described above, it is considered that an original sample data, not a difference data, is inserted for every plurality of prescribed samples, and thereby an (accumulated) integrated data on the reception stage is refreshed. It can be said in this instance that the inserted original sample data is an absolute data representative of an absolute value in comparison with the difference data corresponding to a relative value between respective samples. The absolute data of this type serves in the same way as transmission data employed in the ordinary PCM, i.e., linear PCM. An example of such a system will be described as follows with reference to FIG. 2. In this instance, for example, an 8-bit compressed difference data is obtained from a 14-bit sample data and is used for transmission. A 14-bit absolute data is added to the transmission data after every 16 samples of 8-bit difference data. The difference data are accumulated and integrated on the reception side to yield a regenerated signal, and an integrated difference data is refreshed with the absolute data each time the difference data is received.

With such an arrangement, even if an error is produced in the course of the transmission, the integrated value is corrected to a proper value each time the absolute data is supplied, and the error produced has no effect on the succeeding data. However, the original sample data, in this instance, a 14-bit data as described above, is compressed to an 8-bit difference data and transmitted, so that the above-described absolute data requires 14 bits, i.e., the bit number of the original sample data. Thus, the present system suffers from the problem that, although the original sample data is compressed to the 8-bit difference data to improve the transmission efficiency, this transmission efficiency is lowered by a fraction of 14 bits of the absolute data and a different kind of data having different bit numbers are composed, thereby causing a circuit for data separation on the reception side to be complicated. In addition, it is assumed in the signal waveform shown in FIG. 3 that an illustrated point F data is lost and an illustrated E point is pre-held. Thereupon, a regenerated signal for F→G→H changes to F'→G'→H' as shown in the FIG. 3. Further, the regenerated signal waveform, if refreshed at point H, changes to E→F'→G'→H'→H. Accordingly, the regenerated signal waveform is discontinuous at two portions between E~H' and between H~H'. Namely, the prior PCM transmission system suffers from the drawback that the regenerated signal waveform has many distortion components.

SUMMARY OF THE INVENTION

In view of the drawbacks with the conventional PCM transmission system, it is an object of the present invention to provide an improved PCM transmission system, and a device therefore, in which, upon transmitting successive difference data of an original sample data as in a DPCM system, the difference data partly lost due to an error can be effectively corrected with little distortion thereof in addition to the assurance of high efficiency of the transmission.

A method for a PCM transmission system according to a first embodiment of the present invention includes the steps of providing a difference data having a bit number less than that of the original sample data based thereon; providing an absolute data having a bit number less than that of said original sample data for each data block by removing a less significant bit, each data block comprising a plurality of said difference data; transmitting a transmission signal including said difference data and said absolute data while receiving said transmission signal; preparing a received difference data and a received absolute data based on said difference data and absolute data respectively; integrating said received difference data to provide demodulated information; comparing said demodulated information with said received absolute data; and refreshing said integrated value by said received absolute data value only when the difference between both of said compared values becomes more than a prescribed value which corresponds to an error of the absolute value with regard to the original sample data.

A PCM transmitting device according to a second embodiment of the present invention comprises a differential data generator means for estimating successive differences between respective samples based on an original PCM signal produced by successively sampling and digitizing an imput analog signal and thereby generating a differential data having a bit number less than that of the original sample data; an absolute data generator means for generating an absolute data corresponding to the original PCM samples for each data block, each of said blocks including a plurality of said differential data therein, based on said original PCM signal, and having a bit number less than that of said original sample data; and a transmitter means for transmitting a transmission signal including said differential and absolute data respectively generated by said differential data generator means and said absolute data generator means.

A PCM receiver device, according to a third embodiment of the present invention, for receiving and demodulating a transmission signal, including a differential data composed of successive differential information between original sample data and an absolute data composed of original sample value information for each data block, each of said data blocks comprising a plurality of said difference data, the device is characterized in that said receiver device comprises a separation means for separating and extracting a received difference data and a received absolute data respectively corresponding to said difference data and said absolute data from a received signal; an integrator means for integrating said received difference data yielded by said separating and extracting means to obtain a demodulated signal; comparison means for comparing said demodulated signal comprising an integrated value yielded by said integrator means, with said received absolute data yielded by said separation means, and for issuing a refresh command only when the difference between both said demodulation signal and received absolute signal exceeds a prescribed value; and refreshing means responsive to said refresh command issued from said comparator means for refreshing the above integrated value from integrator means with said received absolute data.

A further embodiment of the present invention is to provide a data transmission system, wherein, in a near instantaneous difference data PCM system, an absolute data having a bit number less than that of an original sampling data is formed at each block, a difference main data, a scale information and the absolute data are transmitted on the transmitting side and are separated on the receiving side, and a received difference data is formed from the main data and scale information and integrated to provide demodulated information which is compared with the received absolute data, thereby enabling the integrated value to be refreshed by the received data only when the difference between the demodulated information and the received absolute data exceeds a predetermined value.

PREFERRED EMBODIMENT OF THE INVENTION

Figure 1:
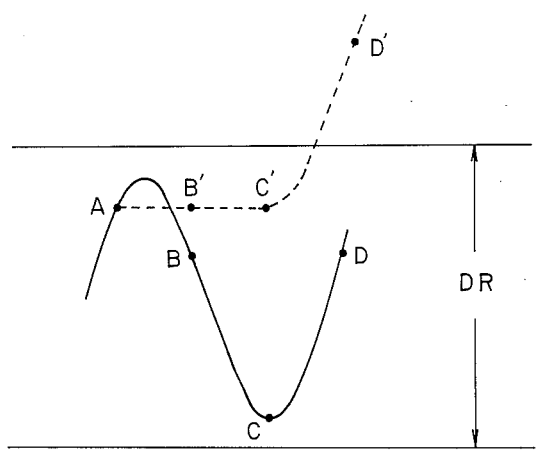
FIG. 1 is a waveform view illustrating a prior art transmission system.
Figure 2:
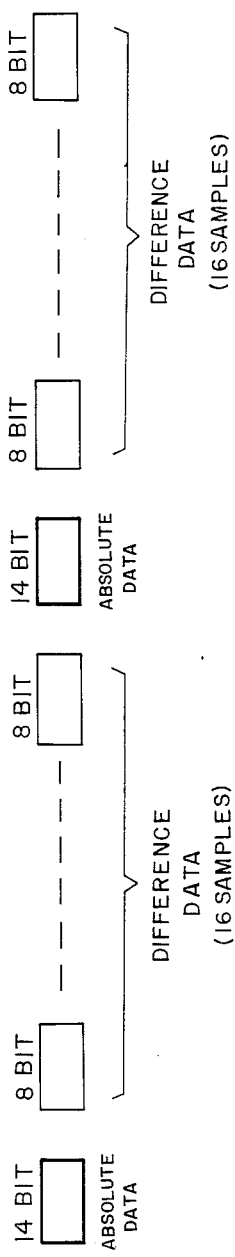
FIG. 2 is a data format of the prior art transmission system.
Figure 3:
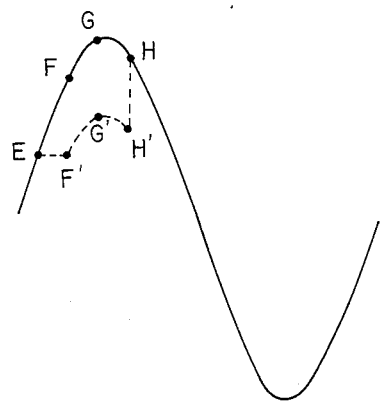
FIG. 3 is a waveform view illustrating a prior art transmission system.
Figure 4:
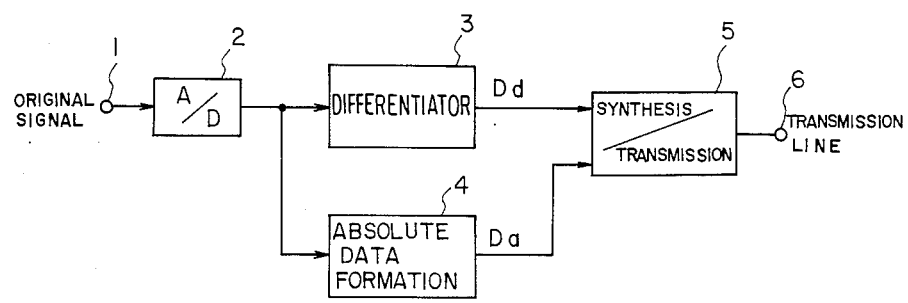
FIG. 4 is a block diagram designating an arrangement of an embodiment of a transmitting device according to the present invention.
Figure 5:
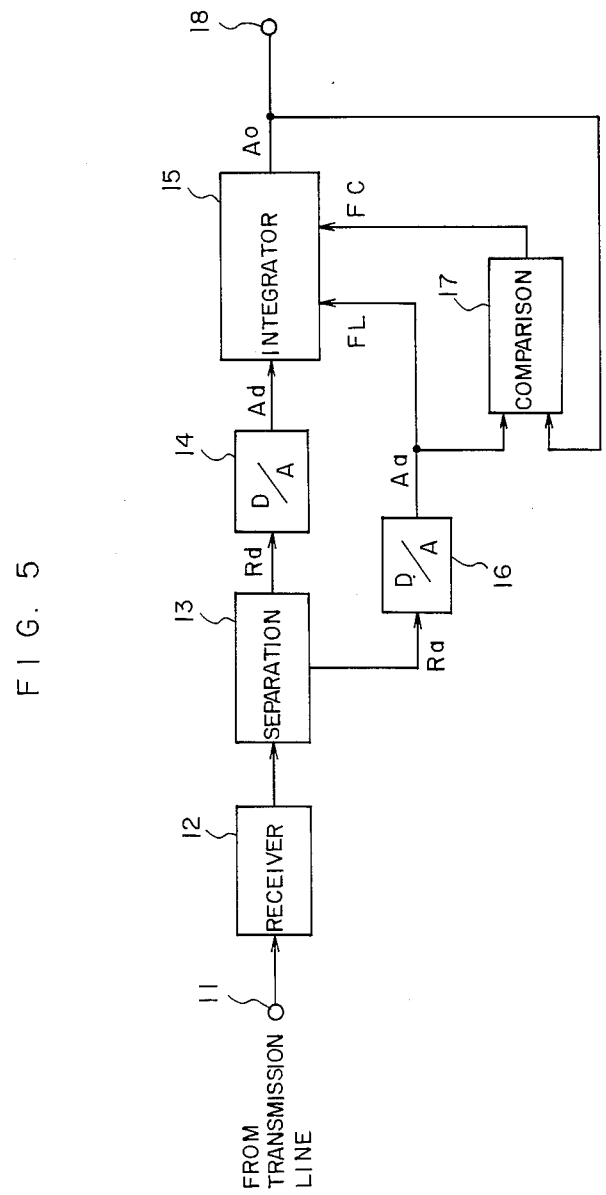
FIG. 5 is a block diagram of a receiver device in the same embodiment as shown in FIG. 4.

FIGS. 4 and 5 respectively show an embodiment of transmitter and receiver devices according to the present invention.

Figure 6:
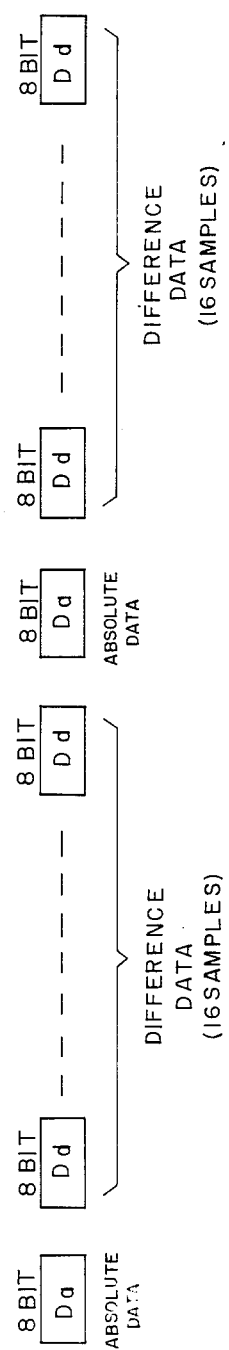
FIG. 6 is an exemplary format of transmission data in the same embodiment.

As shown in a transmitting device of FIG. 4, an analog signal provided to an input terminal 1 is sampled by an analog-to-digital (hereinafter abbreviated as A/D) converter 2, and converted for example, to 14 bit digital data. The original sample data, i.e., the original PCM data obtained from an A/D converter 2, are respectively supplied to a differentiator 3 and an absolute data generator 4. The differentiator 3 provides successive differences between given original sample data such as 8 bit difference data Dd which has a lower bit number than the original data. The absolute data generator 4 compresses an original sample data of each data block, each block comprising a preset sample number, for example, 16 samples, to, for example, the most significant 8 bits by removing the least significant 6 bits, thereby producing them as an absolute data Da. Namely, the absolute data is composed of the most significant 8 bits of the original data by deleting the least significant 6 bits of the original data. Thus, the absolute data is the same as the data obtained by digitizing the original analog data by an 8 bit A/D converter, and has a larger quantizing error than the 14 bit original data but has the same bit number as the 8 bit difference data. The respective output data Dd and Da of the differentiator 3 and absolute data generator 4 are synthesized in a synthesizer/transmitter 5, and for example modulated as needed for transmission and transmitted from a transmitter output terminal 6 to a transmission system. In the present embodiment, the transmission system has a single transmission line, and the synthesizer/transmitter 5 synthesizes the difference data Dd and the absolute data Da in a time divisional manner and transmits them to the transmission line. As the difference data Dd and the absolute data Da have the same bit number, the synthesizer is simpler in construction than the case where the absolute and difference data have different bit numbers. Accordingly, in the synthesizer/transmitter 5, before transmission data in the present embodiment is modulated the transmission data is formatted as shown in FIG. 6.

In the receiving device of FIG. 5, a transmission signal is provided from the transmission system, i.e., transmission line to the receiver input terminal 11. The transmission signal is then delivered to a receiver circuit 12, and transferred to a separation circuit 13. The transmission signal, if subjected to modulation upon transmission thereof, is demodulated at the receiver circuit 12, and a reception data, formatted as shown in FIG. 6 is supplied to the separation circuit 13. The separation circuit 13 separates the reception data into difference data Rd and absolute data Ra. The difference data Rd delivered from the separation circuit 13 is converted through a D/A converter 14 to an analog difference data Ad, and thereafter supplied to an integrator 15. The absolute data Ra provided from the separation circuit 13 is converted through a D/A converter 16 to an analog absolute data Aa, and thereafter supplied to a comparator 17. The same analog absolute data Aa is also supplied to the integrator 15 as a refresh value FL. The integrator 15 accumulates and integrates the analog difference data Ad supplied from the D/A converter 14 and delivers it to the next stage, when a later-described refresh command FC is given the above integrated value is refreshed by the refresh value FL which is given at the time of the refresh command FC. Specifically the integrated value from the integrator 15 is replaced with the refresh value FL for the accumulation and an integration and accumulation of succeeding analog differential data Ad is employed thereafter. An integrated output Ao from the integrator 15 is delivered to the comparator 17 to compare it with the analog absolute data Aa provided from the D/A converter 16, and only when the difference between both of the data exceeds a prescribed or predetermined value (region), for example, a value corresponding to an error fraction of the 8 bit absolute data, the comparator 17 delivers the refresh command FC to the integrator 15.

Namely, the refresh command FC is produced less frequently by using data, such as the absolute data having a larger quantizing error than the original data and thereby reducing the amount of discontinuous distortion. The above integrated output Ao from the integrator 15 is transmitted from a regeneration output terminal 18 as a demodulated signal.

Figure 7:
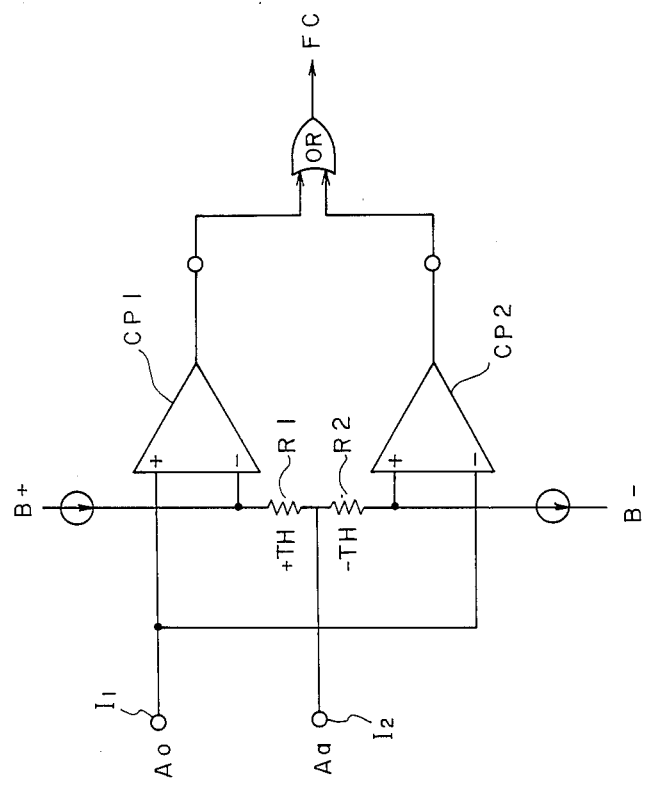
FIG. 7 is a circuit block diagram showing an exemplary comparator in the same embodiment.

Further, a window type comparator constructed as shown in FIG. 7 may be employed as the comparator 17 when the integrated output Ao is compared with the analog signal Aa outputed from the D/A converter 16, as shown in FIG. 5.

In FIG. 7, the integrated output Ao from the integrator 15 and the analog absolute data Aa obtained from the D/A converter 16 are respectively delivered to the input terminals $I_1$ and $I_2$. A constant current is supplied from power sources $B_+$ and $B_-$ to a series circuit of resistors R1 and R2, and the above analog data Aa is applied from the input terminal $I_2$ to a connection point (middle point) between the resistors R1 and R2. If the values of the resistors R1 and R2 are the same, voltage drops over each of the resistors becomes equal. If the voltage drop is assumed to have a value TH which corresponds to the aforementioned predetermined value, voltages (Aa+TH) and (Aa−TH) appear respectively on both ends of the series ciruit of the resistors R1 and R2, and are respectively delivered to an input of a comparator CP1 on the minus (−) side thereof and an input of a comparator CP2 on the plus (+) side thereof. The integrated output Ao supplied to the input terminal $I_1$ is provided to an input of the comparator CP1 on the plus (+) side thereof and to an input of the comparator CP2 on the minus (−) side thereof, and compared with the voltage (Aa+TH) and the voltage (Aa−TH), respectively. If the above integrated output Ao is higher than the voltage (Aa+TH), H (high level) is produced from the comparator CP1, while if the integrated output Ao is lower than the voltage (Aa−TH), H (high level) is produced from the comparator CP2. In addition, if the above integrated output Ao lies between the voltages (Aa+TH) and (Aa−TH), L (low level) is supplied from both the comparators CP1 and CP2. Consequently, if an "or" gate is provided between the outputs from both comparators CP1 and CP2 and the output of the "or" gate is provided to the integrator 15 as the refresh command, the integrator 15 is refreshed only when the integrated output Ao exceeds a region from the voltages (Aa+TH) to (Aa−TH) with regard to the value TH corresponding to the error between the original sample data and 8 bit absolute data. Specifically the arrangement shown in FIG. 7 has a window ranging from the voltage (Aa+TH) to the voltage (Aa−TH) varying in the way it conforms with the analog absolute data Aa, and the arrangement serves as a window comparator which provides L for an input Ao within the window and H for an input Ao outside the window.

Figure 8:
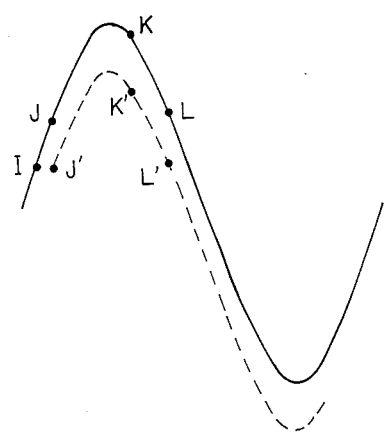
FIG. 8 is a view illustrating the same embodiment.

Accordingly, in the receiver means shown in FIG. 5, when the difference between the analog absolute data Aa and the integrated output Ao from the integrator 15 lies in the range of ±TH (+TH~ −TH), the integrated value is not refreshed, but when the above difference exceeds the range ±TH, the integrated value from the integrator 15 is refreshed with the analog absolute data Aa. In the present embodiment, the values of ±TH are adjusted to the magnitude of 8 bit data error, so that the integrated value is refreshed only when the integrated output Ao and the analog absolute data Aa cause an error larger than 8 bit accuracy. This means that no correction is effected when a DC fraction error in the demodulated output is small, and that correction is effected only when the above error is large. For example, as shown in FIG. 8, if a waveform I→J→K→L is transmitted and a point J data is lost due to some error, an I point data is pre-held to a J′ point, and an absolute data is transmitted at point K′. But, if the error lies within the 8 bit accuracy, the integrated value is not refreshed. A regenerated waveform in tthis instance becomes I→J′→K′→L′. Accordingly, with the present system, the integrated value is refreshed only when any error caused gets extremely large, so that the number of refresh timings are reduced with a lower occurrence of any discontinous portion. Further, clipping, etc., is effectively prevented, due to the lower frequency of refresh signals from being caused due to accumulation of DC fraction errors. Besides, the accuracy of the absolute data to be transmitted is substantially sufficient, as far as it is responsive to an error range detected in the comparator 17. Provided that, for example, the above detected error range corresponds to the 8 bit accuracy, the transmitted absolute data is also sufficient to be a data not much exceeding 8 bits, and deterioration of transmission efficiency due to the absolute data transmission is also conspicuously reduced.

As described above, with the arrangement of the embodiment of the PCM transmission device according to the present invention, the 8-bit absolute data, for example, is inserted for transmission into a data block comprising 8-bit differential data at each data block. In this way, such data transmission can be effected, that practically bears comparison with the prior system in which a 14-bit absolute data is inserted for transmission for each data block, each block comprising 8-bit differential data. The present invention thus achieves substantially high efficiency. In addition, also for the lack of any data portion, since the integrated value is not refreshed provided that a DC fraction error due to the pre-hold ranges remains within 8-bit accuracy, while it is refreshed only when the above error exceeds the above 8-bit accuracy error range to achieve, the reduced number of refresh times. Thus, fewer discontinuous signal portions may be produced than ind previously known refresh mechanisms. In the present system, a DC fraction error due to some lack of a data and due to the pre-hold, etc., may be ignored provided that the above error is small. Such a DC fraction error has in general less influence on the regenerated signal with more reduced changes of the error and with a more prolonged time interval between changes and further with a greater decrease in the number of changes. However, in the present embodiment, the DC fraction error is ignored only with the reduced amount of the changes. Besides, since the number of refresh times is reduced, and the time intervals of the changes of the error are prolonged while the number of the changes is reduced, the regenerated signal is not deteriorated substantially. Thus the present system is very practical.

In addition, although certain preferred embodiments of the present invention have been illustrated and described, it should be understood that many changes and modifications may be made therein without departing from the scope of the appended claims.

For example, although in the above embodiment, the analog type integrator 15 was employed as an integrator on the receiver side, a digital type may be employed as another embodiment to construct a receiver device.

Figure 9:
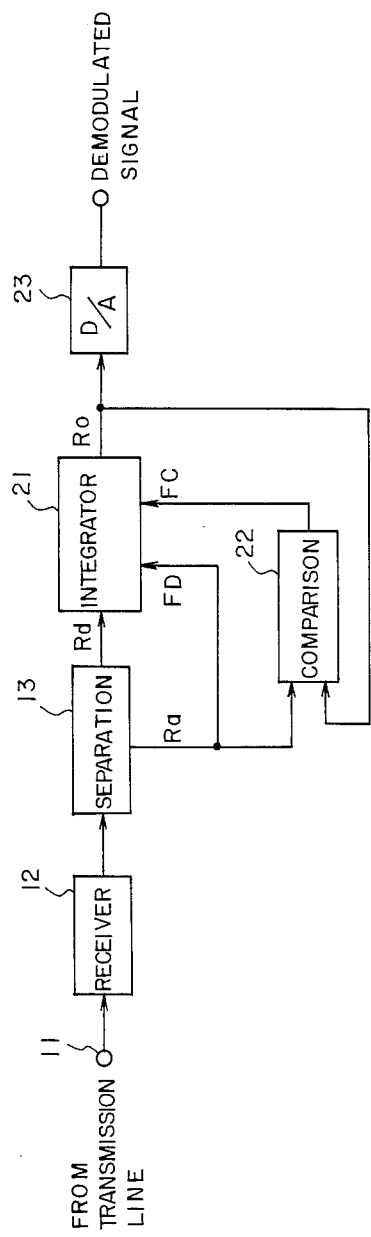
FIG. 9 is a block diagram showing the arrangement of another embodiment according to the present invention.

FIG. 9 shows a block diagram of a receiver device with the use of a digital integrator.

In FIG. 9, the same symbols will be applied to the same elements as in FIG. 5 and detailed description thereof neglected. The separation circuit 13 separates a received difference data Rd and an absolute data Ra and delivers them independently. The difference data Rd available from the separation circuit 13 is supplied in this instance to a digital integrator 21, while an absolute data Ra provided from the same separation circuit 13 is supplied to a digital comparator 22. The same absolute data Ra is also supplied to the digital integrator 21 as a refresh data FD. The integrator 21 accumulates and integrates and delivers the difference data available from the separation circuit 13, while it allows the resultant integrated value, as a later-described refresh command FC is provided, to be refreshed to the refresh data FD supplied at that point of time. Namely, the integrated value from the integrator 21 is replaced with the refresh data FD for accumulation and integration of the succeeding difference data. The integrated output Ro from the integrator 21 is delivered to a comparator 22 and compared with the absolute data Ra provided from the separation circuit 13. Only when the difference of both data exceeds a prescribed value (range), the refresh command FC is supplied from the comparator 22 and delivered to the integrator 21. The above integrated output Ro from the integrator 21 is converted to an analog value through a D/A converter 23, and delivered as a demodulated signal from a regeneration output terminal 18.

Moreover, it is a matter of course that combinations of digital processing systems with analog processing systems may be changed, for example one of an integrator and a comparator of a receiver device is adapted to be an analog type while the other a digital type. In this instance, an A/D converter and a D/A converter are inserted in place as necessary.

In addition, a bit number of an absolute data, and a set range of the comparator, e.g., a window range may be properly selected in response to kinds and properties of transmission signals, desired transmission accuracy, and conditions of transmission systems, etc. Then, although an error range of any absolute data is ideally selected to be less than a value corresponding to a set range of a comparator, values set to those other than the above value may also be sufficiently effective for practical use.

Further, the present invention is not limited to a general type DPCM system, and may be applicable to all the PCM systems in which difference data are transmitted, accumulated, integrated, and demodulated.

Figure 11:
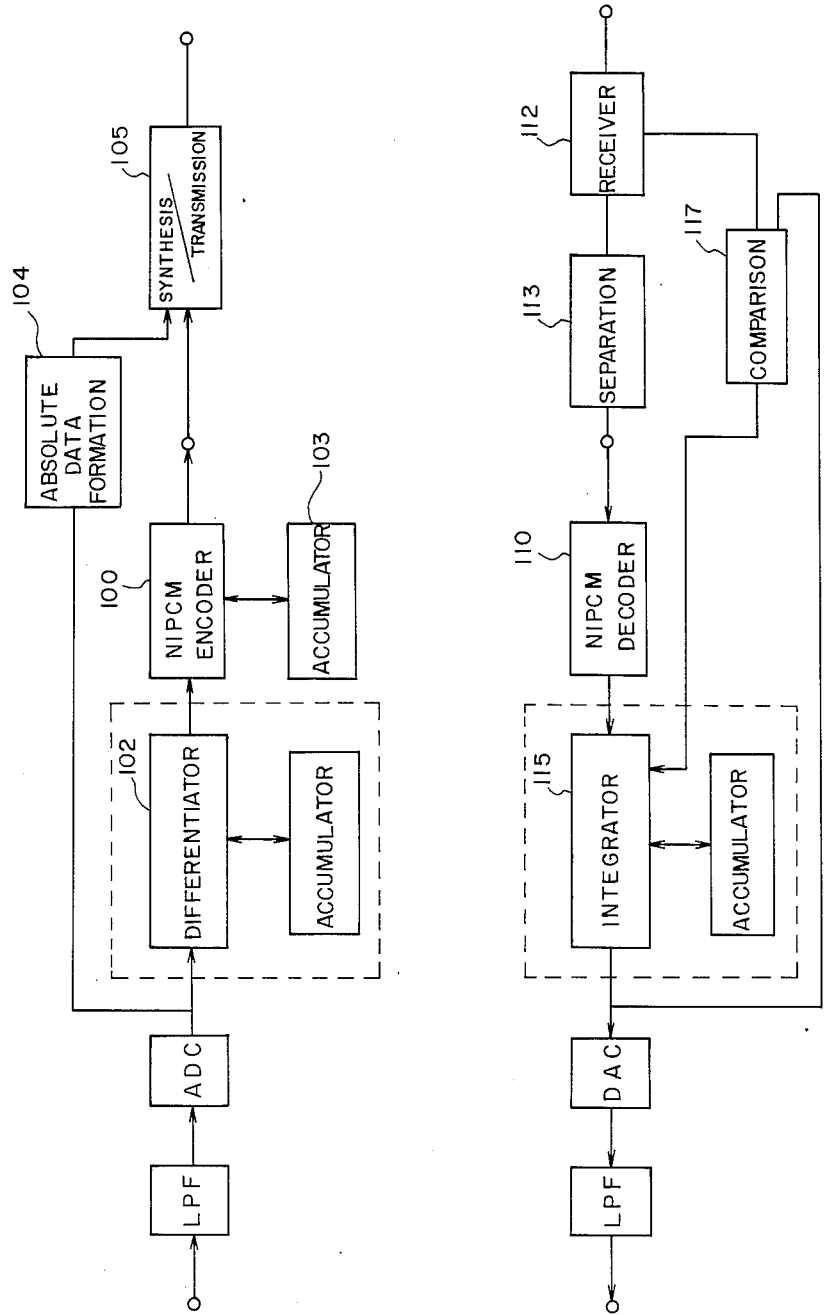
FIG. 11 is a block diagram of the embodiment shown in FIG. 10.

For example, as shown in FIG. 11 the present invention may be applicable to DC-PCM transmission of a difference data near instantaneous compression system (NIPCM) in which a scale data representative of a significant digit position determined for every data block, each block comprising a plurality of difference data, is transmitted for every data block, whereby the transmission of the difference data is compressed to a data having a reduced bit number.

In this DC-PCM system, the difference data of the original 16 bits is generated from differentiator 102 and is compressed by the action of NIPCM 100 to obtain 8-bit compressed data and removed bits. The accumulation is achieved by adding accumulated data from the previous data to the removed bits. The added data then serves as the next accumulated data. When a carry occurs due to an overflow in the addition by the accumulator, it is added to the compressed data as part of the transmission data. Should the sign of the compressed data reverse when the data is added to the carry, 1 will be added to the scale value for the block. Because of the action of the accumulator 103, the transmission data thus obtained contains removed bits, though the lower bits are truncated. The accumulator 103 in the DC-PCM system has the advantages that reproduced signals do not suffer DC fluctuation or DC shift and that during transmission of high-frequency and low-frequency signals whose difference data vary widely in level, low frequencies that are completely removed can be recreated.

The data in the DC-PCM system is composed of frames in which each comprises a predetermined number of blocks. The block format consists of a scale and a predetermined number of transmission data.

The decoder is composed of a NIPCM decoder 110 to expand the received transmission data, an integrator 115 to convert difference data into linear data and an analog converter (DAC and LPF) to change digital data into sound signals.

Figure 10:
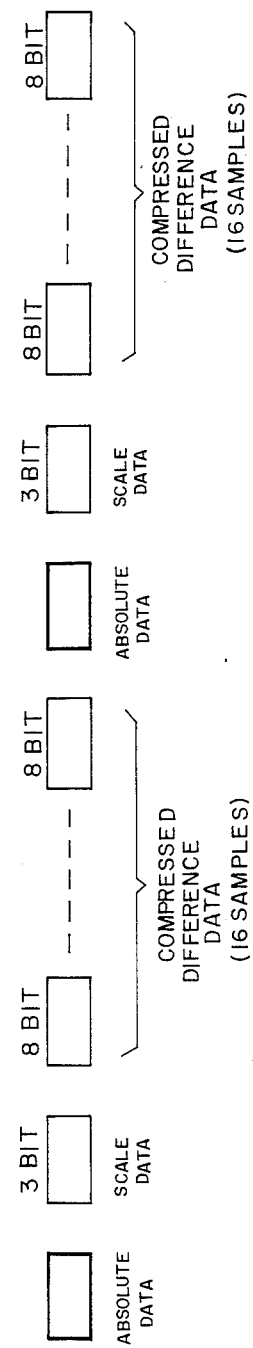
FIG. 10 is an exemplary format of transmission data illustrating still another embodiment of the present invention.

On the one hand, in the transmitting device of the difference data NIPCM, the absolute data having a bit number lower than that of the original sample data is obtained by the absolute data forming circuit 104 at every block, and the transmission signal including the main transmission data, scale information and absolute data is transmitted. Namely, the transmission data in this instance is formatted as shown in FIG. 10 so that a 3-bit scale data and an absolute data having a proper bit number are respectively inserted into 8-bit, for example, difference data at each of the above difference data. Further, the above scale data and the absolute data may not be disposed by adjoining each other, and a proper number of difference data may be inserted between the above data. In addition, a data number of data blocks corresponding to the scale data and a data number of data blocks corresponding to the absolute data may be different from each other (namely, repetition periods of the scale data and the absolute data may be different from each other.).

On the other hand, in the receiving device of NIPCM, the transmission signal is received by a receiver 112, and the main transmission data, scale information, and absolute data are separated. The received difference data is obtained from the main transmission data and scale information in NIPCM decoder 110, the difference data is integrated by the integrator 115 to produce a demodulated information. The demodulated information is compared with the received absolute data obtained from the separation circuit in a comparator 117. The received absolute data is applied to the integrator 115 to refresh the demodulated information only when the difference between the demodulated information and the absolute data exceeds the predetermined value.

An arrangement of a transmitter device in application of the present invention to the above difference data quasi-instantaneous compression system PCM transmission comprises, in addition to a transmitter device for the difference data quasi-instantaneous compression system PCM transmission, a means for generating an absolute data based on an original sample data for every data block and a means for transmitting the absolute data so generated to a transmission system. In addition, an arrangement of a receiver device likewise, comprises, in addition to a receiver device for the difference data quasi-instantaneous compression system PCM transmission, a means for separating the absolute data from a received signal, a means for comparing an integrated demodulation value with a received absolute data, and a means for refreshing the integrated value with the received absolute data in response to the of the comparison result.

According to the present invention, in PCM transmission for transmitting successive difference data of an original sample data as in a DPCM system, such a PCM transmission system and a device thereof can be provided, that is capable of effectively correcting lack of any data from an original data caused by any error with high transmission efficiency and minimal deformation.

What is claimed is:

1. A PCM transmission system for transmitting and receiving a signal corresponding to an original signal, the system including means (2) for sampling the original signal to generate an original PCM sample data having a first bit number, the system comprising:
    means (3) for obtaining a difference data (Dd) having a second bit number less than said first bit number; means (4) for providing an absolute data (Da) having a less significant bit number than said first bit number for each data block, wherein each data block includes a plurality of said difference data, means (5) for transmitting a transmission signal including said difference data and said absolute data, means (12–14 and 16) for receiving said transmission signal and providing a received difference data and a received absolute data respectively, based on said difference data and absolute data, means (15) for integrating said received difference data to provide a demodulated information signal, and means (17) for comparing said demodulated information signal with said received absolute data and refreshing said integrated value with said received absolute data only when the difference between said demodulated information signal and said received absolute data becomes more than a prescribed value.

2. The PCM transmission system according to claim 1, wherein said absolute data is obtained by removing less significant bits of said original PCM sample data and is formed of more significant bits of said original PCM sample data.

3. The PCM transmission system according to claim 2, wherein said prescribed value is determined based upon an error between said absolute data and the original PCM sample data.

4. The PCM transmission system according to claim 1, wherein, in differential data NIPCM in which every data block of a main transmission data of less bit number than DPCM data and comprising more significant bits of DPCM data and a scale information indicating a bit position of significant bits in DPCM data are transmitted at every data block, the absolute data of less bit number than the original PCM sample data is obtained at every data block, the transmission data comprising said main transmission data, scale information and absolute data is transmitted from a transmitting side and the transmitted data received by a receiving side and is separated into the main transmission data, scale information and absolute data, the main transmission data and scale information form the received differential data which is integrated to provide a demodulated information, the demodulated data is compared with the absolute data, and the integrated value is refreshed by the received absolute value only when the difference between the demodulated data and absolute data exceed the prescribed value.

5. The PCM transmission system according to claim 4 wherein the less significant bit of DPCM data is accumulated to produce a carry and the carry is also transmitted together with the main transmission data.

6. The PCM transmission system according to claim 1, wherein the bit number of said difference data is equal to that of said obsolute data.

7. A PCM transmitter device for transmitting a transmission signal indicative of an analog signal in a PCM system including the transmitter device and a receiver device for receiving said transmission signal, the transmitter device comprising:
    means for successively sampling and digitizing the analog signal to produce an original PCM signal including successive original PCM sample data having a first bit number, difference data generator means for estimating successive differences between respective ones of the original PCM sample data to generate a difference data having a second bit number less than the first bit number of the original PCM sample data, an absolute data generator means for generating an absolute data corresponding to the original PCM signal for each data block, said data block including a plurality of said difference data, based on said original PCM signal, and having a third bit number which is a predetermined number less than said first bit number of said original PCM sample data, by removing the predetermined number of least significant bits from the original PCM sample data, and a transmitter means for transmitting the transmission signal including said difference data and said absolute data,
    wherein said receiver device includes means for providing a received difference data and a received absolute data respectively, based on said difference data and absolute data, means for integrating said received difference data to provide a demodulated information signal, and means for comparing said demodulated information signal with said received absolute data and refreshing said integrated value with said received absolute data only when the difference between said demodulated information signal and said received absolute data becomes more than a prescribed value.

8. A PCM-receiver device for receiving and demodulating a transmission signal, including a difference data composed of successive difference information between original sample data and an absolute data composed of original sample value information for every data block, each of said data blocks comprising a plurality of said difference data, characterized in that said receiver device comprises a separating means for separating and extracting a received difference data and a received absolute data each corresponding to said difference data, and said absolute data from a received signal, integrator means for integrating said received difference data yielded by said separating and extracting means to obtain a demodulated signal, a comparator means for comparing said demodulated signal obtained by said integrator means with said received absolute data yielded by said separating means, and issuing a refresh command only when the magnitude of the difference between both said demodulated signal and said received absolute signal exceeds a prescribed value, and a refreshing means responsive to said refresh command issued from said comparator means for refreshing an integrated value available from said integrator means with said received absolute data.

9. A PCM transmission method for transmitting and receiving an original signal, the method comprising the steps of:

sampling the original signal to generate an original PCM sample data having a first bit number;

obtaining a difference data (Dd) which corresponds to a difference between said original PCM sample data and a given reference data, said difference data having a second bit number less than said first bit number;

providing an absolute data (Da) having a less significant bit number than said first bit number for each data block by removing least significant bits from said original PCM sample data, wherein each data block includes a plurality of said difference data;

forming a transmission signal including said difference data and said absolute data, and transmitting said transmission signal;

providing a received difference data and a received absolute data which are respectively based on said difference data and absolute data;

integrating said received difference data with an integrated sum to provide a demodulated information signal;

comparing said demodulated information signal with said received absolute data; and refreshing said integrated sum with a new integrated sum corresponding to said received absolute data only when the difference between said demodulated information signal and said received absolute data becomes more than a prescribed value.

* * * * *